United States Patent
Dittus et al.

(10) Patent No.: US 9,873,530 B2
(45) Date of Patent: Jan. 23, 2018

(54) SECURING MODULES IN AN ELECTRONICS SYSTEM

(71) Applicant: Lenovo Enterprise Solutions (Singapore) Pte. Ltd., Singapore (SG)

(72) Inventors: Karl K. Dittus, Durham, NC (US); Daniel P. Kelaher, Holly Springs, NC (US); William M. Megarity, Raleigh, NC (US); John P. Scavuzzo, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 764 days.

(21) Appl. No.: 13/913,741

(22) Filed: Jun. 10, 2013

(65) Prior Publication Data

US 2014/0360916 A1 Dec. 11, 2014

(51) Int. Cl.
*G06F 1/16* (2006.01)
*H05K 5/00* (2006.01)
*B65B 5/04* (2006.01)
*H05K 7/14* (2006.01)
*G06F 1/18* (2006.01)
*G11B 33/12* (2006.01)

(52) U.S. Cl.
CPC ............. *B65B 5/04* (2013.01); *H05K 7/1411* (2013.01); *G06F 1/183* (2013.01); *G06F 1/187* (2013.01); *G11B 33/123* (2013.01); *H05K 7/1405* (2013.01); *H05K 7/1409* (2013.01); *H05K 7/1461* (2013.01)

(58) Field of Classification Search
CPC .......... G06F 1/183; G06F 1/187; G06F 1/184; G06F 1/186; G11B 33/123; H05K 7/1409; H05K 7/1424; H05K 7/1405; H05K 7/1411; H05K 7/1412; H05K 7/1461; H05K 7/1467
USPC .................. 206/722; 312/223.2; 361/679.32, 361/679.33, 679.58, 724, 725, 727
See application file for complete search history.

(56) References Cited

U.S. PATENT DOCUMENTS

| | | | |
|---|---|---|---|
| 5,600,542 A | 2/1997 | Malgouires | |
| 5,626,406 A | 5/1997 | Schmid | |
| 5,909,935 A | 6/1999 | Esperandieu et al. | |
| 6,166,900 A * | 12/2000 | Flynn et al. | 361/679.35 |
| 6,318,679 B1 * | 11/2001 | Yang et al. | 248/27.1 |

(Continued)

*Primary Examiner* — James Wu
(74) *Attorney, Agent, or Firm* — Zilka-Kotab, P.C.

(57) ABSTRACT

A method and apparatus for securing electronic components in an electronics system enclosure are disclosed. An apparatus can include an electronics system enclosure having a compartment adapted to receive a removable electronic component. The apparatus also includes a cam having a portion extending into the compartment sufficient to hinder insertion of the removable electronic component in a default orientation. The portion of the cam includes first and second surfaces. The portion of the cam is configured to deflect sufficient to permit insertion of the removable electronic component into the compartment in response to a normal force. The deflection causes the cam to deflect to a modified orientation. The cam portion returns to the default orientation in the absence of the normal force. The second surface of the portion is configured and arranged to engage a cam lever that is rotatably mounted to the removable electronic component.

15 Claims, 6 Drawing Sheets

(56) References Cited

U.S. PATENT DOCUMENTS

| | | | |
|---|---|---|---|
| 6,490,153 B1 * | 12/2002 | Casebolt et al. | 361/679.33 |
| 6,667,887 B2 | 12/2003 | Sim et al. | |
| 6,688,711 B1 | 2/2004 | Mease et al. | |
| 7,318,532 B1 | 1/2008 | Lee et al. | |
| 7,656,658 B2 * | 2/2010 | Liu et al. | 361/679.37 |
| 7,782,606 B2 | 8/2010 | Baker et al. | |
| 8,023,263 B2 | 9/2011 | Crippen et al. | |
| 2004/0037049 A1 * | 2/2004 | Erickson et al. | 361/726 |
| 2012/0212905 A1 | 8/2012 | Furtura et al. | |

* cited by examiner

SECURING MODULES IN AN ELECTRONICS SYSTEM

FIELD

This disclosure generally relates to electronics systems, and in particular, to securing electronic components in an electronics system enclosure.

BACKGROUND

Electronics systems (e.g., servers, storage systems, switches) include removable electronic components. The various removable electronic components can be inserted and removed without the use of external tools. When the removable electronic components are inserted adjacent to each other into an electronics system enclosure, some usable volume for the module can be sacrificed in order to accommodate integrated interlocking features such as levers, cam surfaces, and cam pins. The volume lost may not only include where the interlocking feature is located, but also along the entire length of the removable electronic component that passes over the volume of the interlocking feature during insertion and removal of the removable electronic component.

SUMMARY

Embodiments of this disclosure provide a method and an apparatus for securing removable electronic components in an electronics system enclosure.

Embodiments are directed toward an apparatus for securing a removable electronic component. The apparatus includes an electronics system enclosure having a compartment adapted to receive a removable electronic component. The apparatus also includes a cam having a portion extending into the compartment sufficient to hinder insertion of the removable electronic component in a default orientation. The portion of the cam includes first and second surfaces. The portion of the cam is configured and arranged to deflect in response to a normal force applied to the first surface. The deflection is sufficient to permit insertion of the removable electronic component into the compartment. The deflection causes the cam to deflect from the default orientation to a modified orientation. The portion of the cam returns to the default orientation in the absence of the normal force. The second surface of the portion is configured and arranged to engage a cam lever that is rotatably mounted to the removable electronic component.

A method of securing a removable electronic component is also described.

BRIEF DESCRIPTION OF THE DRAWINGS

Like reference numbers and designations in the various drawings indicate like elements.

DETAILED DESCRIPTION

Figure 1A:
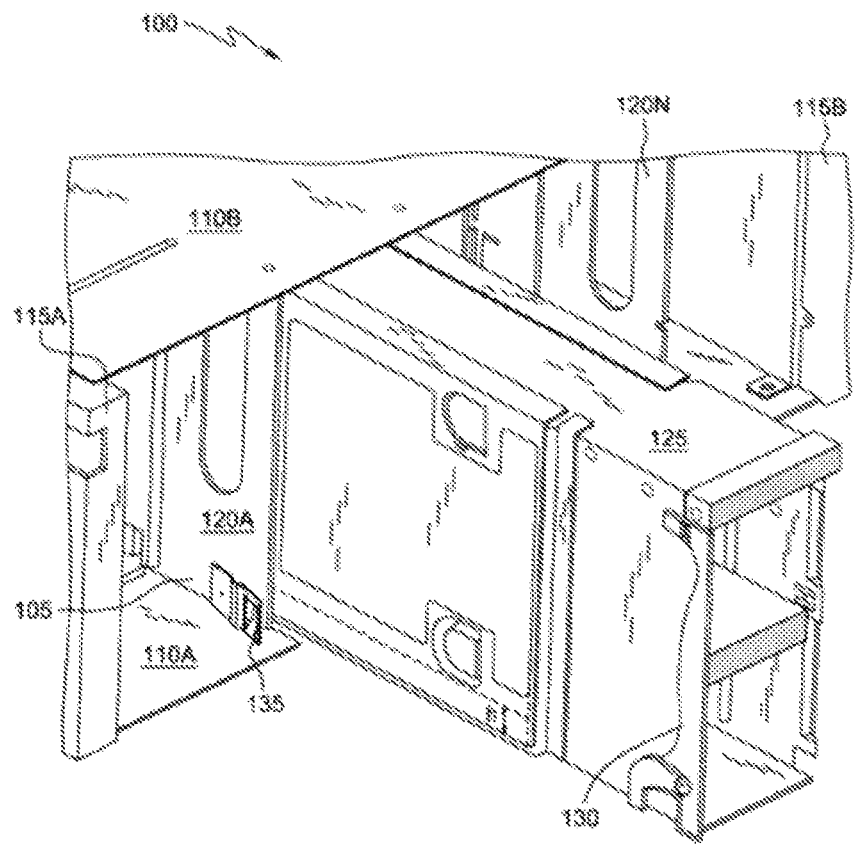
FIG. 1A illustrates a perspective view of an electronics system, according to various embodiments.

Embodiments of this disclosure are directed to an apparatus for securing a removable electronic component in an electronics system enclosure and a method of doing the same.

Consistent with embodiments of this disclosure, an apparatus for securing a removable electronic component is described. Particular aspects are directed toward a cam designed to deflect in response to the insertion of an electronic component (e.g., a computer server module or blade) into a compartment of a larger chassis. Once the electronic component is fully seated, the cam can then snap back in order to allow the cam lever or similar feature to latch and secure the electronic component within the chassis. Despite protruding into the compartment, the cam is designed to avoid hindering the insertion of the electronic component by deflecting substantially out of the compartment. This can be particularly useful for use with an electronic component that substantially fills the insertion space while also allowing the cam to secure a fully-inserted electronic component.

Certain embodiments are directed toward an apparatus include an electronics system enclosure. The electronics system enclosure includes a compartment adapted to receive a removable electronic component (e.g., hard disc drives, servers, routers, input/output board, memory board, processor board). The electronics system enclosure also includes a cam that, when in a default orientation, has a portion which extends sufficiently into the compartment to hinder insertion of the removable electronic component. The portion of the cam extending into the compartment includes first and second surfaces. The portion is configured and arranged to deflect in response to a normal force applied which can be applied to the first surface by the removable electronic component. The deflection from the default orientation to a modified orientation can permit insertion of the removable electronic component into the compartment. The portion of the cam returns to the default orientation in the absence of the normal force. The second surface of the portion is configured and arranged to engage a cam lever that is rotatably mounted to the removable electronic component.

Removable electronic components can be inserted and removed from an electronics system (e.g., servers, storage systems, switches) without the use of tools. Generally, some volume of the removable electronic component is lost to accommodate interlocking features that protrude into the enclosed space that houses the electronic components and that can be used to secure the removable electronic component. An electronic component can include, but is not necessarily limited to, a server, a storage system, or switches. An electronics system may, in some embodiments, be referred to as an information technology system. To simplify the present description and the claims that follow, "chassis" will be used to include the various types of electronics systems enclosures. The volume lost may be over the entire length of the removable electronic component in some cases. In the absence of a sufficiently deflectable cam, some portion of the volume is generally lost to allow for insertion and removal of the components in adjacent bays of the electronics system. Various aspects of the present disclosure can be particularly useful for recovering such lost volume.

Consistent with certain embodiments, the chassis and/or electrical component can be designed to accommodate a standardized form factor such as a blade form factor or a standard module form factor. The available volume for an electrical component can thereby be constrained by such form factors, and this volume can be further reduced by cutouts for a cam. Accordingly, embodiments are directed toward a deflectable cam that facilitates the full use of the available volume to a designer of an electrical component.

FIG. 1A illustrates a perspective view of an electronics system 100, according to various embodiments. The electronics system 100 includes a chassis 105 and can include one or more removable electronic components 125. The chassis 105 can be separated into one or more compartments, the compartments configured and arranged to receive the one or more removable electronic components 125.

As illustrated, the chassis 105 can be a rectangular enclosure having one open side. The chassis 105 can include a base panel 110A, side panels 115A, 115B, a rear panel (not shown in FIG. 1A), a top panel 110B, and a dividing panel 120A. In some embodiments there may be additional dividing panels, illustrated as 120N. The side panels 115A, 115B can be mounted opposite each other to the base panel 110A. The rear panel can be mounted to the base panel 110A and the side panels 115A, 115B. The top panel 110B can be mounted opposite the base panel 110A to the side panels 115A, 115B and the rear panel. This configuration defines a rectangular enclosure with one open side and an internal volume that can be adapted to receive the removable electronic component 125.

The internal volume of the chassis 105 can be separated into modular compartments with a dividing panel 120A. As illustrated, some embodiments have more than one dividing panel, e.g., dividing panel 120N, which separate the internal volume of the chassis 105 into additional modular compartments. The modular compartments can be adapted to receive the removable electronic component 125. The dividing panel 120A can create a compartment that is adapted to receive removable electronic components 125 stacked horizontally (as illustrated in FIG. 1) and/or removable electronic components 125 that are stacked vertically (see FIGS. 3-6).

The dividing panel 120A can be mounted to the base panel 110A, the top panel 110B, and the rear panel. As illustrated, the dividing panel 120A can be installed such that it is parallel to the side panels 115A, 115B. In some embodiments, the dividing panel 120A can be installed perpendicular to the side panels 115A, 115B. The dividing panel 120A can be mounted to the base panel 110A and the top panel 110B, but not the rear panel. The dividing panel 120A can be a single panel that is mounted to both the base panel 110A and the top panel 110B. The dividing panel 120A can also include multiple panels that are individually mounted to the base panel 110A and the top panel 110B. As a non-limiting example, the dividing panel 120A can be similar to a track which acts as a guide for the removable electronic component 125. FIGS. 3-6 illustrate such a dividing panel.

The dividing panel 120A can include a cam 135. The cam 135 can be affixed to a face of the dividing panel 120A in a first compartment. In some embodiments, the cam 135 can be affixed to the side panel 115A. In some embodiments, the cam 135 and the dividing panel 120A or side panel 115A can be a single continuous piece of material, e.g., as opposed to separate pieces of material connected with a fastener. The face of the dividing panel 120A is parallel to the side panels 115A, 115B in the illustrated embodiment. The cam 135 can have a portion that extends into a second compartment when in a default orientation, the second compartment adjacent to the first compartment. The "default orientation," as referred to in this Specification, includes the orientation in which the cam 135 has not deflected from the second compartment to the first compartment. The cam 135, as illustrated in FIG. 1A, is in a modified orientation. The "modified orientation," as referred to in this Specification, includes an orientation in which a normal force has been applied to a surface of the portion of the cam 135 that extends into the second compartment and the portion of the cam 135 has deflected from the default orientation. The cam is configured and arranged to deflect from the default orientation to the modified orientation when a normal force is applied, generally by inserting the removable electronic component 125 into the second compartment. The cam 135 is illustrated in the default orientation in FIG. 2.

As illustrated in FIG. 1A, the second compartment is configured and arranged to receive the removable electronic component 125. The removable electronic component 125 is in an intermediate position as it is being installed in the chassis 105. During the installation, the removable electronic component 125 comes into contact with a surface of the portion of the cam 135 that extends into the second compartment. The contact provides a normal force that is sufficient to deflect the portion of the cam 135 toward (into) the first compartment, thus allowing the removable electronic component to be inserted into the second compartment.

Figure 1B:
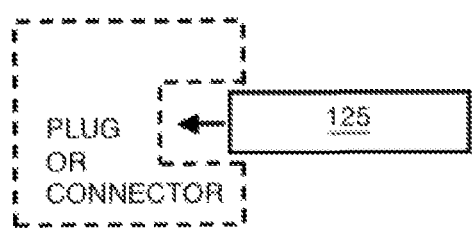
FIG. 1B illustrates the seating of a removable electronic component in a plug or connector, according to various embodiments.

As the removable electronic component 125 is inserted, the cam 135 will return to the default orientation. The removable electronic component 125 can be of variable thickness and elasticity to allow for the cam 135 to return to the default orientation in the absence of the normal force. Because the cam 135 deflects into the first compartment, the removable electronic component 125 can utilize the volume generally lost in order to allow for insertion of the component. This volume can be defined by the height of the cam, shown as "h," the length of the removable electronic component 125, and the depth that the cam 135 extends into the second compartment. Once the cam 135 is in the default orientation, the cam lever 130, which can be rotatably mounted to the removable electronic component, can engage with the surface of the portion of the cam 135 extending into the second compartment. The surface of the portion of the cam 135 can provide a camming surface for the cam lever 130. The cam lever 130 can be used to apply an insertion force to secure the removable electronic component 125 in the chassis 105, which can provide a force necessary to seat the removable electronic component 125 into a plug or connector. FIG. 1B illustrates the seating of the removable electronic component 125 into the plug or connector.

Figure 2:
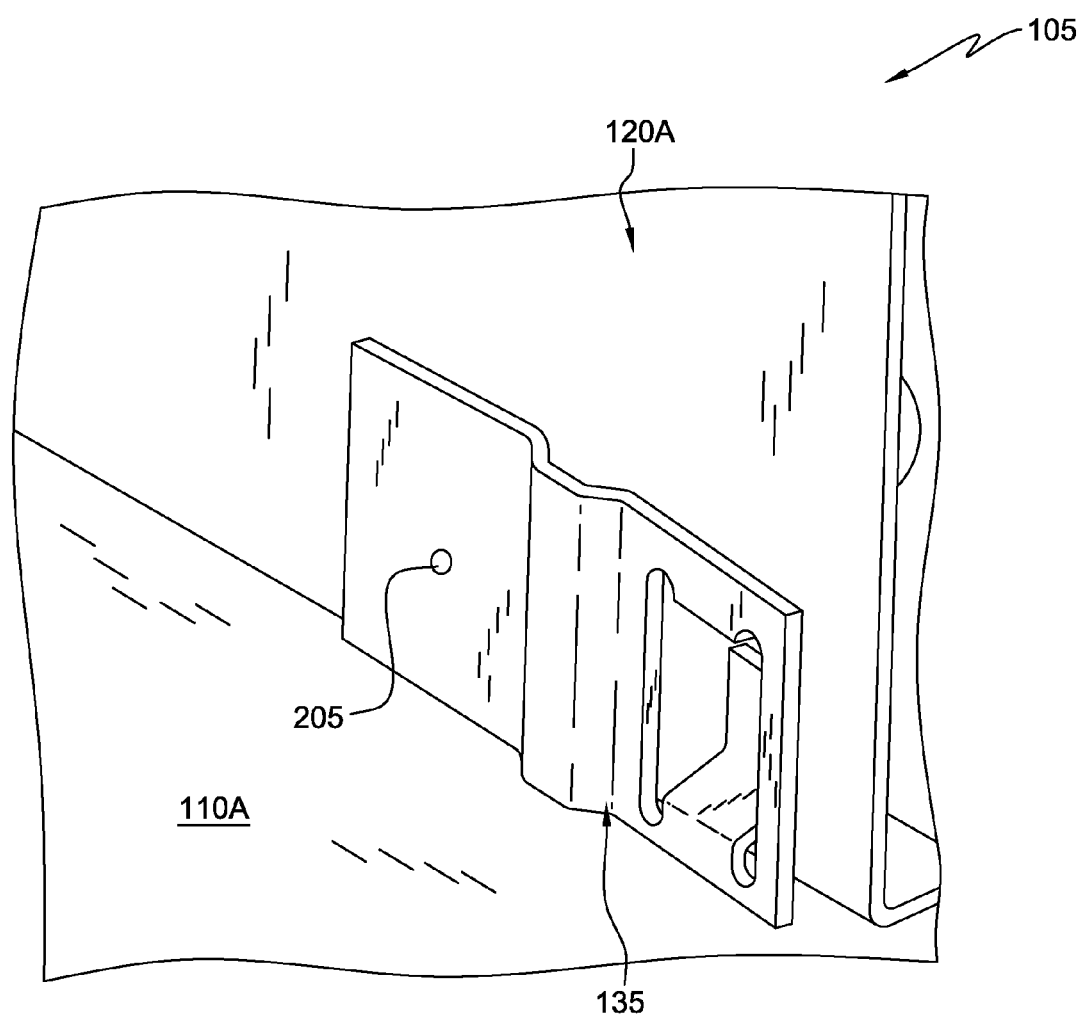
FIG. 2 illustrates a perspective view of a cam in a default orientation, according to various embodiments.

FIG. 2 illustrates a perspective view of the cam 135 in the default orientation, according to various embodiments. As described above, the cam 135 can be mounted to a face of the dividing panel 120A in the first compartment of the chassis 105. In some embodiments, the cam 135 can be mounted to the dividing panel 120A near the base panel 110A such that the cam lever 130 (FIG. 1A) of the removable electronic component 125 (FIG. 1A) can engage with a surface of the cam 135, which can provide an insertion force to assist with installation of the removable electronic component 125.

The cam 135 can be mounted to the dividing panel 120A using a variety of mounting methods. As a non-limiting example, the cam 135 can be welded to the dividing panel 120A. The fastening point 205 is the point at which the cam 135 is mounted to the dividing panel 120A. The fastening point 205 can represent a weld, rivet, stake, or any other suitable method of mounting the cam 135 to the dividing panel 120A. The method of mounting the cam 135 secures the cam 135 to the dividing panel 120A such that the cam 135 remains in place when the cam lever 130 is engaged with the surface of the portion of the cam 135 extending into the compartment in which the removable electronic component 125 is being inserted.

The fastening point 205 also represents the point of rotation about which the portion of the cam 135 extending into the second compartment rotates when deflecting from the default orientation to the modified orientation. When a normal force is applied to a surface of the portion of the cam 135 in the compartment in which a removable electronic component 125 is being inserted, the surface of the portion of the cam 135 receiving the force can rotate about the fastening point 205.

The portion of the cam 135 extending into the compartment that is configured and arranged to receive the removable electronic component 125 can include a surface that is adapted to engage the cam lever 130 and provide an insertion force. This surface can be the same surface as the one that receives the normal force in some embodiments. The cam 135 can be of a belt loop configuration as illustrated in FIGS. 1 and 2. The cam 135 can also be of any suitable configuration that provides a camming surface for the cam lever 130. This can include, for example, a cam pin, a block, or any other similar configuration. In some embodiments, the cam 135 surface can be ramped to assist with the deflection of the cam 135 as the removable electronic component 125 is inserted into the compartment. In some embodiments, the removable electronic component 125 can be ramped to assist with the deflection of the cam 135.

Consistent with embodiments of this disclosure, the cam 135 can be made of a material that is flexible enough to accommodate insertion of the removable electronic component 125 and capable of returning to its default orientation when the normal force during insertion is removed. As a non-limiting example, the cam 135 can be made of spring steel.

Figure 3:
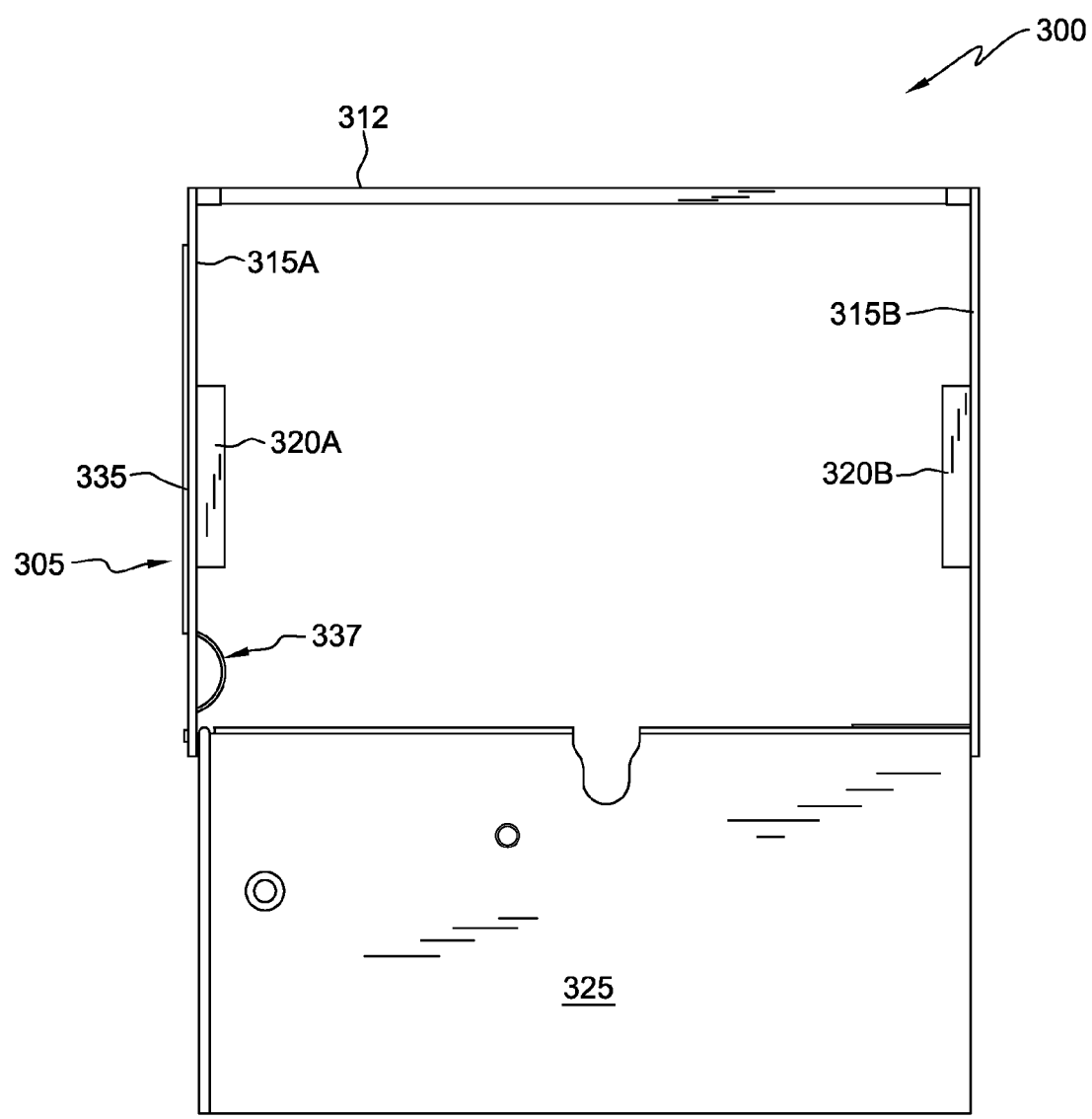
FIG. 3 illustrates a top view of an electronics system, according to various embodiments.

FIG. 3 illustrates a top view of an electronics system 300, according to various embodiments. Aspects of FIG. 3 can be the same as or similar to aspects of FIGS. 1 and 2. The electronics system 300 includes a chassis 305 and can include one or more removable electronic components 325. The chassis 305 can be separated into one or more compartments, the compartments configured and arranged to receive the one or more removable electronic components 325.

As illustrated, the chassis 305 can be a rectangular enclosure having one open side. The chassis can include a base panel (not shown in FIG. 3), side panels 315A, 315B, a rear panel 312, a top panel (not shown in FIG. 4), and dividing panels 320A, 320B. In some embodiments there may be additional dividing panels. In some embodiments, the chassis 305 can be a section of a larger chassis. The side panels 315A, 315B can be mounted opposite each other to the base panel. The rear panel can be mounted to the base panel and the side panels 315A, 315B. The top panel can be mounted opposite the base panel to the side panels 315A, 315B and the rear panel 312. This configuration defines a rectangular enclosure with one open side and an internal volume that can be adapted to receive the removable electronic component 325.

The internal volume of the chassis 305 can be separated into modular compartments with dividing panels 320A, 320B. The modular compartments can be configured and arranged to receive removable electronic components 325 of different sizes. The chassis 305 can include additional modular compartments that are configured and arranged to similarly receive removable electronic components. This can include additional removable electronic components stacked vertically above and below (corresponding to out of and into the page, respectively) the removable electronic component 325.

In the illustrated embodiment, the dividing panels 320A, 320B are mounted to the side panels 315A, 315B. Each of the dividing panels 320A, 320B are mounted separately and function similar to a track to guide the removable electronic component 325 into the compartment.

The side panel 315A can include a cam 335 having a surface 337. The cam 335 can be mounted to a face of the side panel that is on the opposite side of the volume into which the removable electronic compartment 325 is inserted. The cam 335 can have a surface 337 on a portion of the cam 335 that extends, when in the default orientation, into the compartment of chassis 305 in which the removable electronic component 325 is going to be installed. The cam 335 is illustrated in the default orientation in FIG. 3. The cam 335 is configured and arranged to deflect from the default orientation to the modified orientation when a normal force is applied to the surface 337. The cam 335 is illustrated in the modified orientation in FIG. 4.

As shown in FIG. 3, the cam 335 is in the default orientation as the removable electronic component 325 is about to be inserted into the chassis 305. The surface 337 can be a curved surface as illustrated in FIG. 3 to allow for the cam 335 to deflect as the removable electronic component 325 is inserted into or removed from the chassis 305.

Figure 4:
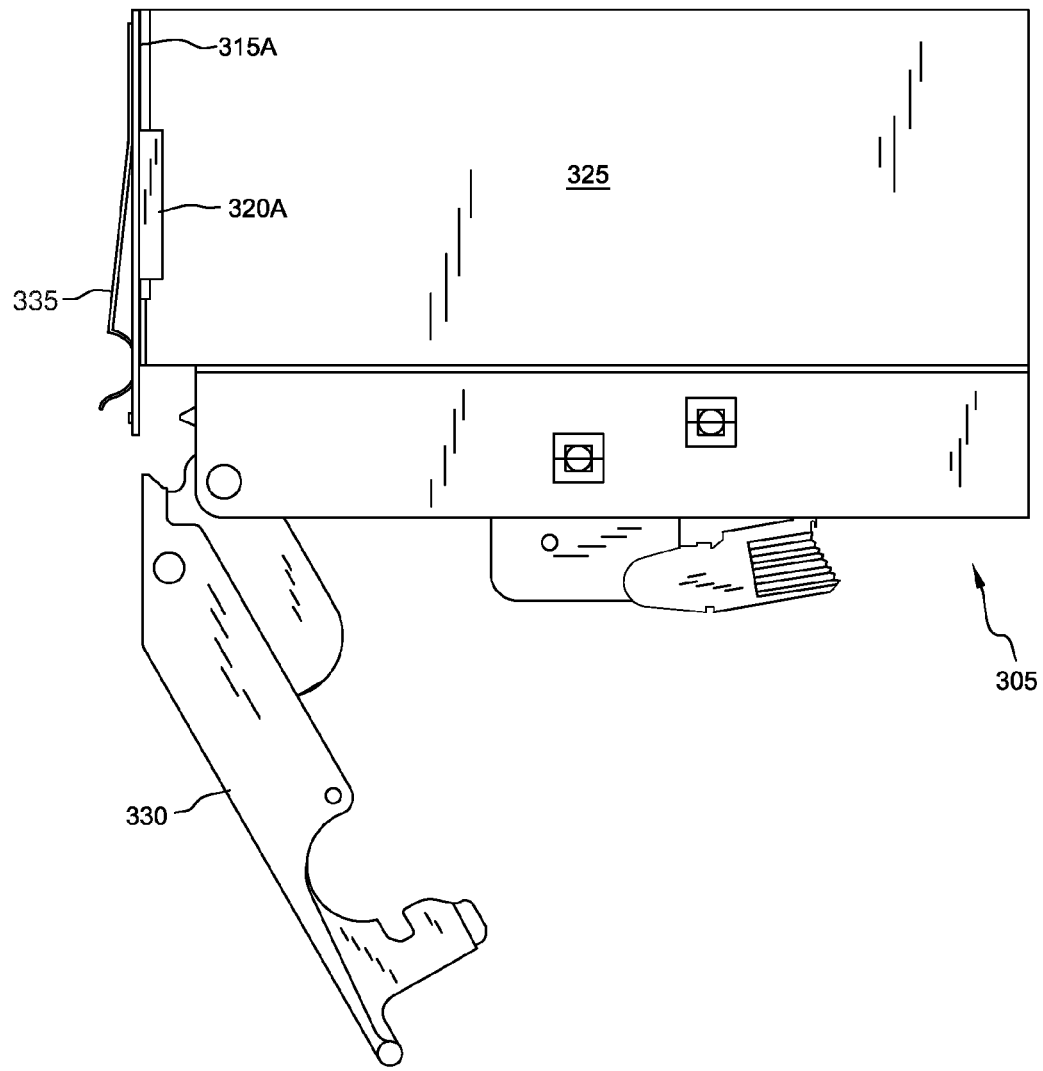
FIG. 4 illustrates a top view of a removable electronic component in an intermediate position during insertion into a compartment of a chassis, according to various embodiments.

FIG. 4 illustrates a top view of the removable electronic component 325 in an intermediate position during insertion into a compartment of the chassis 305, according to various embodiments. The cam 335 is shown in the modified orientation. During insertion into the chassis 305, the removable electronic component 325 provides a normal force to the cam 335 that is sufficient to deflect the portion of the cam 335 extending into the compartment so that the removable electronic component 325 can be inserted into the chassis 305. The cam lever 330 can be used to secure the removable electronic component 325 into the chassis 305 once the cam 335 has returned to the default orientation.

Figure 5:
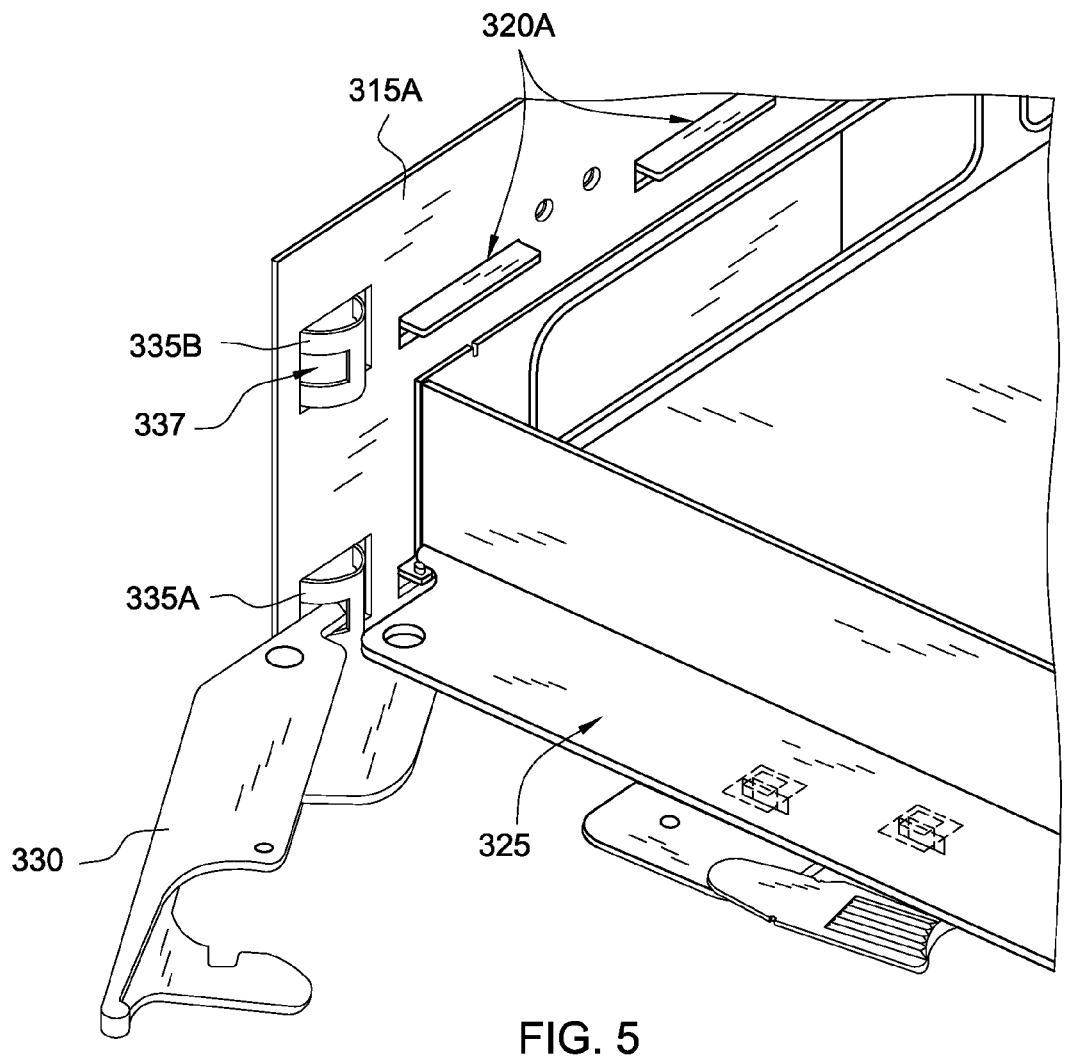
FIG. 5 illustrates a perspective view of a removable electronic component in an intermediate position during insertion into a compartment of a chassis, according to various embodiments.

FIG. 5 illustrates a perspective view of the removable electronic component 325 in an intermediate position during insertion into a compartment of the chassis 305, according to various embodiments. FIG. 5 illustrates two compartments in the chassis 305. Each compartment is configured and arranged to include a cam, illustrated as 335A and 335B. Consistent with embodiments of this disclosure, the cam 335A is in the default orientation and can engage with the cam lever 330 to provide the insertion force required to seat and secure the removable electronic component 325. The cams 335A and 335B can be the same and will be referred to generally as the cam 335 to simplify the present description. The cam 335 includes a surface 337 that is adapted to engage the cam lever 330.

As shown in the figure, the removable electronic component 325 may have a cutout section in order to allow the cam 335 to return from the modified orientation (during the installation process) to the default orientation. In some embodiment, this cutout section may be sufficient to allow the cam 335 to return to the default orientation while allowing for the rest of the removable electronic component 325 to utilize the width of the compartment for remaining length of the removable electronic component 325. This can, in some embodiments, increase the utilizable volume of the removable electronic component 325.

Figure 6:
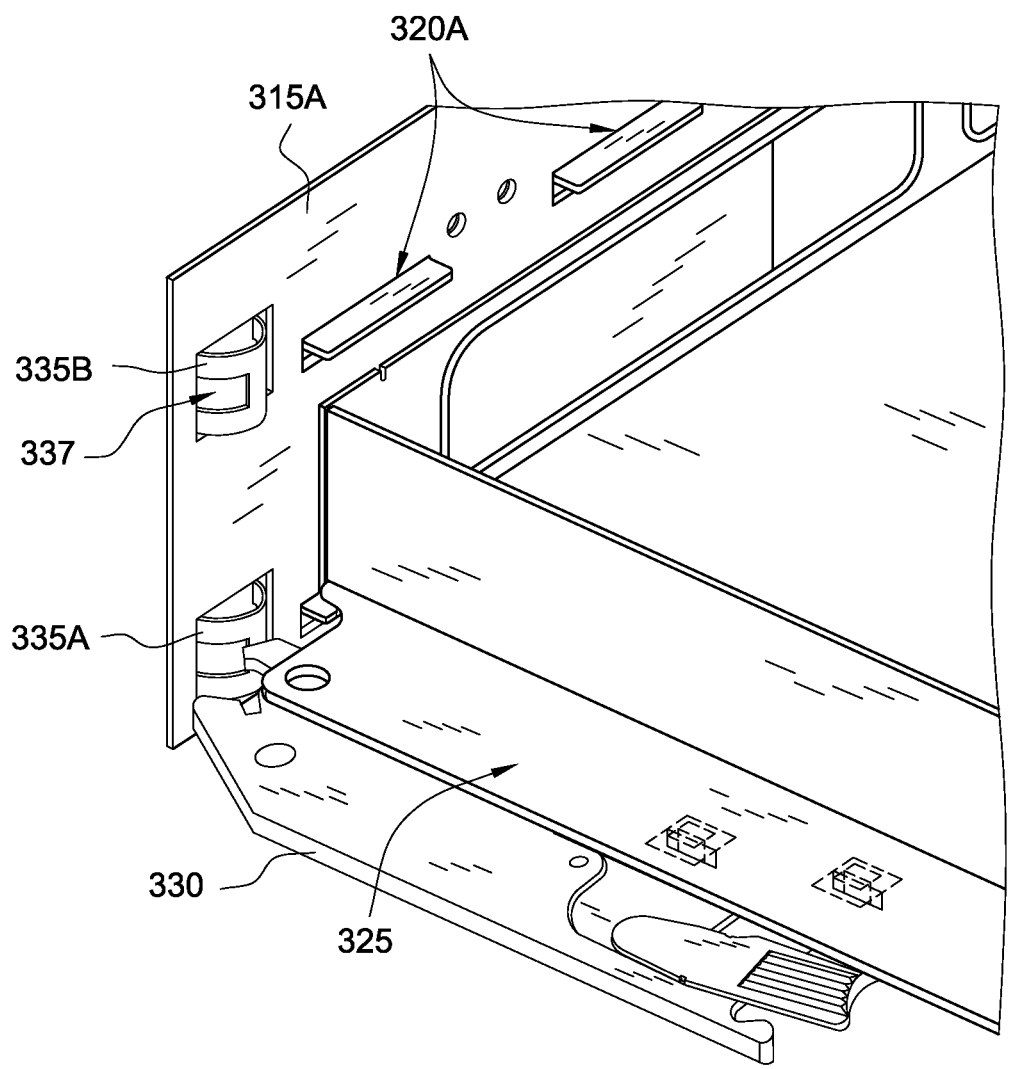
FIG. 6 illustrates a perspective view of a removable electronic component in the installed position in an electronics system, according to various embodiments.

FIG. 6 illustrates a perspective view of the removable electronic component 325 in the installed position in the electronics system 300, according to various embodiments. Consistent with embodiments of this disclosure, the cam lever 330 of the removable electronic component 325 was engaged with the surface 337 of the cam 335. In some embodiments, this camming provides an insertion force to secure the removable electronic component 325 in the chassis 305. In some embodiments, the cam lever 330 and the cam 335 can remain in place, which can prevent the removable electronic component 325 from unintentionally being removed from the chassis 305.

The terminology used in this Specification is for the purpose of describing particular embodiments only and is not intended to be limiting. The singular forms "a," "an," and "the" are intended to include the plural forms as well, unless the context clearly indicates otherwise. When used in this Specification, the terms "includes" and/or "including," specify the presence of the stated features, integers, steps, operations, elements, and/or components, but do not preclude the presence or addition of one or more other features, integers, steps, operations, elements, components, and/or groups thereof.

In the previous Detailed Description, reference was made to the accompanying drawings (where like numbers represent like elements), which form a part hereof, and in which is shown by way of illustration specific exemplary embodiments in which the embodiments can be practiced. These embodiments were described to enable those skilled in the art to practice the embodiments, but other embodiments can be utilized and logical, mechanical, electrical, and other changes can be made without departing from the scope of the present disclosure. In the previous Detailed Description, numerous specific details were set forth to provide a thorough understanding of embodiments. Embodiments, however, can be practiced without these specific details. In other instances, well-known electronic devices, structures, and techniques have not been shown in detail, e.g., in order not to obscure embodiments.

Different instances of the word "embodiment" as used within this Specification can, but do not necessarily, refer to the same embodiment and it is also understood that the recited embodiments can be used in various combinations. While the foregoing is directed to exemplary embodiments, other and further embodiments of the disclosure can be devised without departing from the basic scope thereof, and the scope thereof is determined by the claims that follow.

What is claimed is:

1. An apparatus comprising:
an electronics system enclosure having:
a compartment adapted to receive a removable electronic component; and
a cam having a portion extending, in a default orientation, into the compartment sufficient to hinder insertion of the removable electronic component, the portion including first and second surfaces and configured and arranged to:
deflect, in response to a normal force applied to the first surface and sufficient to permit the insertion of the removable electronic component into the compartment, from the default orientation to a modified orientation; and
return to the default orientation in absence of the normal force; and
the second surface configured and arranged to:
engage a cam lever rotatably mounted to the removable electronic component.

2. The apparatus of claim 1, wherein the cam is affixed to a dividing panel, the dividing panel separating the compartment into first and second compartments.

3. The apparatus of claim 2, wherein the portion extends, in a default orientation, into the second compartment and the cam is affixed to a face of the dividing panel in the first compartment.

4. The apparatus of claim 1, wherein the cam is affixed to an external panel of the electronics system enclosure.

5. The apparatus of claim 1, further comprising a dividing panel, the dividing panel separating the compartment into first and second compartments, wherein the cam and the dividing panel are a single continuous piece of material, the cam configured to deflect from the second compartment to the first compartment to receive the removable electronic component.

6. The apparatus of claim 1, wherein the cam includes a cam pin.

7. The apparatus of claim 1, wherein the cam includes a belt loop.

8. The apparatus of claim 1, wherein the removable electronic component is at least one of a hard dive, a server, input-output board, memory board, processor board and a router.

9. The apparatus of claim 1, wherein the surface of the portion of the cam extending into the compartment is configured to provide an insertion force in response to a force provided by the cam lever, the insertion force sufficient to seat the removable electronic component in a plug.

10. The apparatus of claim 2, wherein the cam is affixed to the dividing panel at a fastening point.

11. The apparatus of claim 10, wherein the fastening point includes at least one of a weld, a rivet, and a stake.

12. The apparatus of claim 10, wherein the fastening point is a point of rotation of the cam, such that the cam rotates about the fastening point when deflecting from the default orientation to the modified orientation, and when returning to the default orientation in the absence of the normal force.

13. The apparatus of claim 1, wherein the cam has an arm that is affixed to an external side of a panel of the electronics system enclosure towards a first end thereof, the arm being configured to deflect away from the compartment, wherein the portion of the cam is positioned towards a second end thereof.

14. A method, comprising:
inserting a removable electronic component into a compartment of an electronics system enclosure;
causing a cam, having a portion extending, in a default orientation, into the compartment sufficient to hinder insertion of the removable electronic component into the compartment, to deflect sufficiently to permit insertion of the removable electronic component;
causing the cam to return to the default orientation; and
engaging a cam lever with a surface of the cam to provide an insertion force that is sufficient to seat the removable electronic component into a plug.

15. The method of claim 14, further comprising:
disengaging the cam lever;

removing the removable electronic component from the compartment of the electronics system enclosure; and
causing the cam to deflect sufficiently to permit removal of the removable electronic component from the electronics system enclosure.

* * * * *